United States Patent
Yukiiri

(10) Patent No.: US 11,617,264 B2
(45) Date of Patent: Mar. 28, 2023

(54) INTERCONNECT SUBSTRATE AND METHOD OF MAKING THE SAME

(71) Applicant: SHINKO ELECTRIC INDUSTRIES CO., LTD., Nagano (JP)

(72) Inventor: Yuji Yukiiri, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/447,977

(22) Filed: Sep. 17, 2021

(65) Prior Publication Data
US 2022/0104352 A1   Mar. 31, 2022

(30) Foreign Application Priority Data
Sep. 28, 2020  (JP) .............................. JP2020-162183

(51) Int. Cl.
H05K 1/02 (2006.01)
H05K 1/11 (2006.01)
H05K 1/03 (2006.01)

(52) U.S. Cl.
CPC ........... *H05K 1/115* (2013.01); *H05K 1/0313* (2013.01); *H05K 1/0353* (2013.01); *H05K 1/11* (2013.01); *H05K 2201/0209* (2013.01); *H05K 2201/0269* (2013.01)

(58) Field of Classification Search
CPC ........... H05K 1/115; H05K 2201/0209; H05K 2201/0269; H05K 2203/122; H05K 3/4673
See application file for complete search history.

(56) References Cited

U.S. PATENT DOCUMENTS

| | | | |
|---|---|---|---|
| 9,596,754 B2 * | 3/2017 | Iwayama | H05K 1/0353 |
| 9,775,237 B2 * | 9/2017 | Ikeda | H05K 3/4652 |
| 2014/0027163 A1 * | 1/2014 | Min | H05K 3/10 174/250 |
| 2015/0185603 A1 * | 7/2015 | Yoshida | G03F 7/004 430/270.1 |

FOREIGN PATENT DOCUMENTS

JP 2012-235166  11/2012

* cited by examiner

*Primary Examiner* — Ishwarbhai B Patel
(74) *Attorney, Agent, or Firm* — IPUSA, PLLC

(57) ABSTRACT

An interconnect substrate includes a first insulating layer, an interconnect layer formed on a first surface of the first insulating layer, and a second insulating layer formed on the first surface of the first insulating layer to cover the interconnect layer, wherein the second insulating layer includes a first resin layer and a second resin layer, the first resin layer covering at least part of a surface of the interconnect layer exposed outside the first insulating layer, the second resin layer covering the first resin layer, wherein both the first resin layer and the second resin layer contain a resin and a filler, and wherein a proportion of the resin in the first resin layer per unit area is higher than a proportion of the resin in the second resin layer per unit area.

10 Claims, 5 Drawing Sheets

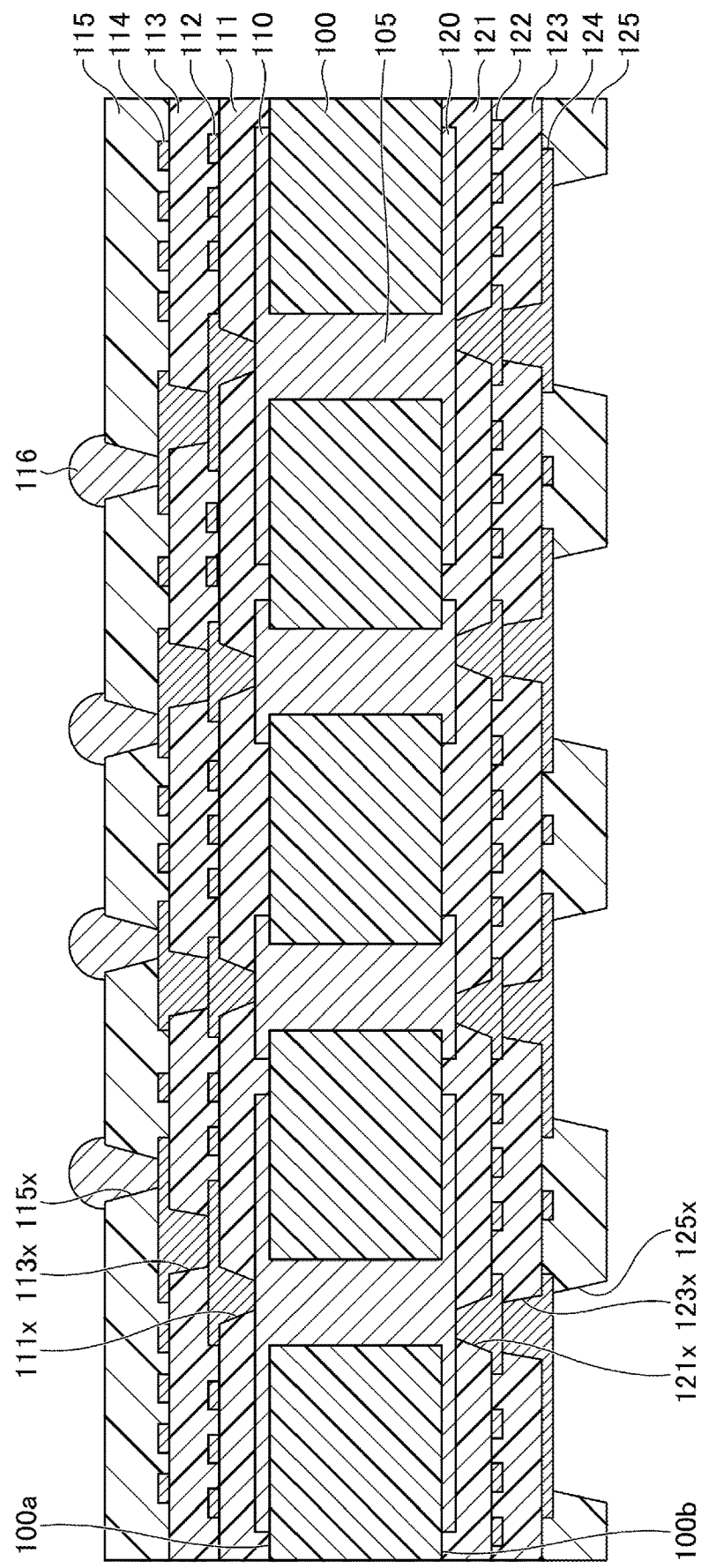

INTERCONNECT SUBSTRATE AND METHOD OF MAKING THE SAME

CROSS-REFERENCE TO RELATED APPLICATIONS

The present application is based on and claims priority to Japanese Patent Application No. 2020-162183 filed on Sep. 28, 2020, with the Japanese Patent Office, the entire contents of which are incorporated herein by reference.

FIELD

The disclosures herein relate to an interconnect substrate and a method of making an interconnect substrate.

BACKGROUND

Interconnect substrates, as known in the art, may have insulating layers containing resin and interconnect layers stacked in an alternating fashion. For such interconnect substrates, adhesion between the insulating layers and the interconnect layers is important. In consideration of this, adhesion between the insulating layers and the interconnect layers may be improved by applying a roughening treatment to the surface of the interconnect layers to create bumps and recesses providing an anchoring effect in the surface of the interconnect layers.

The insulating layers may include a filler in addition to resin. In such a case, the filler comes in contact with the interconnect layers, which makes it difficult to secure adhesion between the insulating layers and the interconnect layers.

Accordingly, it may be desired to provide an interconnect substrate that is capable of improving adhesion between insulating layers containing a filler and interconnect layers.

RELATED-ART DOCUMENTS

Patent Document

[Patent Document 1] Japanese Laid-open Patent Publication No. 2012-235166

SUMMARY

According to an aspect of the embodiment, an interconnect substrate includes a first insulating layer, an interconnect layer formed on a first surface of the first insulating layer, and a second insulating layer formed on the first surface of the first insulating layer to cover the interconnect layer, wherein the second insulating layer includes a first resin layer and a second resin layer, the first resin layer covering at least part of a surface of the interconnect layer exposed outside the first insulating layer, the second resin layer covering the first resin layer, wherein both the first resin layer and the second resin layer contain a resin and a filler, and wherein a proportion of the resin in the first resin layer per unit area is higher than a proportion of the resin in the second resin layer per unit area.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 5 is a cross-sectional view illustrating an example of a multilayer interconnect substrate according to a practical application example.

DESCRIPTION OF EMBODIMENTS

Figure 1A:
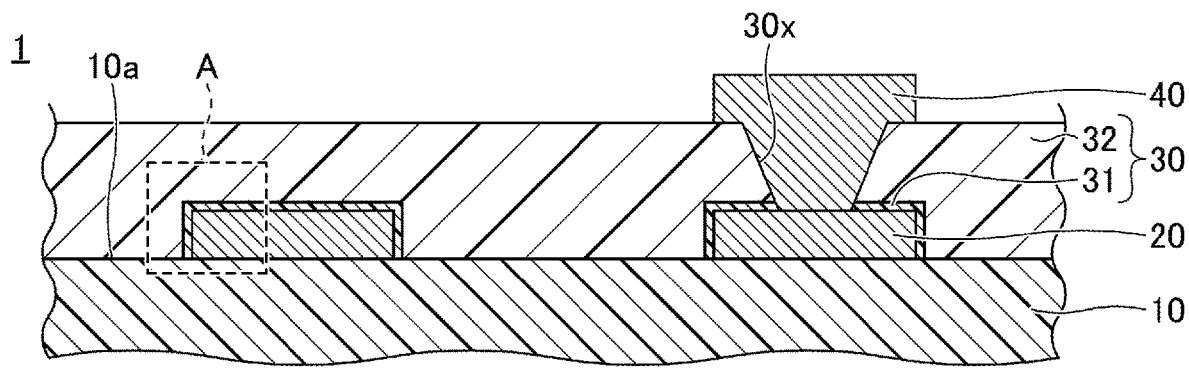
FIGS. 1A and 1B are drawings illustrating an example of an interconnect substrate according to a first embodiment.

In the following, embodiments will be described by referring to the accompanying drawings. In these drawings, the same elements are referred to by the same reference characters, and a duplicate description thereof may be omitted.

First Embodiment

[Structure of Interconnect Substrate]

Figure 1B:
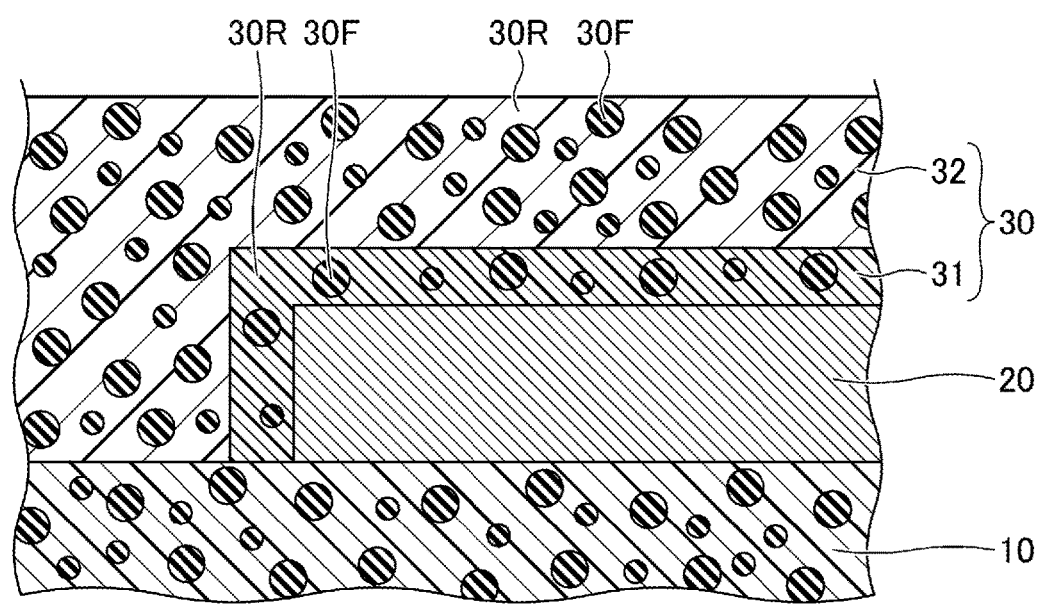

FIGS. 1A and 1B are drawings illustrating an example of an interconnect substrate according to a first embodiment. FIG. 1A illustrates a partial cross-sectional view, and FIG. 1B illustrates an enlarged view of an area A illustrated in FIG. 1A.

Referring to FIGS. 1A and 1B, an interconnect substrate 1 includes an insulating layer 10, an interconnect layer 20, an insulating layer 30, and an interconnect layer 40.

In the present embodiment, for the sake of convenience, the side of the interconnect substrate on which the insulating layer 30 is situated is referred to as an upper side or a first side, and the side on which the insulating layer 10 is situated is referred to as a lower side or a second side. Further, the surface of a member situated on the upper side is referred to as an upper surface or a first surface, and the other surface of the member situated on the lower side is referred to as a lower surface or a second surface. It may be noted, however, that the interconnect substrate 1 may be used in an upside-down position, or may be placed at any angle. Further, a plan view refers to a view taken in the direction perpendicular to an upper surface 10a of the insulating layer 10, and a plane shape refers to the shape of an object as viewed in the direction perpendicular to the upper surface 10a of the insulating layer 10.

The insulating layer 10 may be formed as an interlayer insulating layer between multi-layered interconnects by using build-up construction, for example. In other words, other interconnect layers and other insulating layers may be stacked under the insulating layer 10. Further, other interconnect layers and other insulating layers may be stacked over the insulating layer 30. In this case, the insulating layer 10 and other insulating layers may have via holes formed therethrough, through which the interconnect layers may be connected to each other.

An insulating resin or the like having non-photosensitive (thermosetting) epoxy resin or polyimide resin as a main component, for example, may be used as the material of the insulating layer 10. The insulating layer 10 may contain a filler such as silica ($SiO_2$). The thickness of the insulating layer 10 may be about 10 to 50 micrometers, for example. The thermal expansion coefficient of the insulating layer 10 is approximately 10 ppm/° C. to 50 ppm/° C., for example.

The interconnect layer 20 is formed on the upper surface 10a of the insulating layer 10. The lower surface of the interconnect layer 20 is in contact with the upper surface 10a of the insulating layer 10, and the upper surface and side surface of the interconnect layer 20 are exposed outside the insulating layer 10. Namely, the interconnect layer 20 projects upward from the upper surface 10a of the insulating layer 10. The thickness of the interconnect layer 20 may be about 5 to 25 micrometers, for example. Copper (Cu) or the like may be used as the material of the interconnect layer 20, for example The insulating layer 30 is formed on the upper surface 10a of the insulating layer 10, and covers the interconnect layer 20. An insulating resin or the like having non-photosensitive (thermosetting) epoxy resin or polyimide resin as a main component, for example, may be used as the material of the insulating layer 30. The insulating layer 30 contains a filler 30F such as silica ($SiO_2$). The particle diameter of the filler 30F may be less than or equal to 5 micrometers, for example. The thickness of the insulating layer 30 may be about 10 to 50 micrometers, for example. The thermal expansion coefficient of the insulating layer 30 is approximately 10 ppm/° C. to 50 ppm/° C., for example.

The insulating layer 30 includes a first resin layer 31 and a second resin layer 32. The first resin layer 31 covers the surface of the interconnect layer 20 (i.e., the upper surface and side surface of the interconnect layer 20 in FIGS. 1A and 1B) exposed outside the insulating layer 10. In the case in which the interconnect layer 20 is embedded in the insulating layer 10 with only the upper surface thereof being exposed outside the insulating layer 10, for example, the first resin layer 31 covers only the upper surface of the interconnect layer 20. The second resin layer 32 covers the first resin layer 31. The thickness of the first resin layer 31 is thinner than the thickness of the second resin layer 32. The thickness of the first resin layer 31 is approximately micrometers to 3 micrometers, for example. The thickness of the first resin layer 31 is allowed to vary from place to place, but is preferably thicker than thinner.

The first resin layer 31 substantially covers the surface of the interconnect layer 20 exposed outside the insulating layer 10, but does not have to completely cover the surface. In other words, it suffices for the first resin layer 31 to cover at least a portion of the surface of the interconnect layer 20 exposed outside the insulating layer 10, and the surface of the interconnect layer 20 exposed outside the insulating layer 10 may have a portion in contact with the second resin layer 32. The first resin layer 31 preferably covers 70% or more of the surface of the interconnect layer 20 exposed outside the insulating layer 10, more preferably covers 80% or more, and further more preferably covers 90% or more. It is particularly preferable for the first resin layer 31 to cover all the surface of the interconnect layer 20 exposed outside the insulating layer 10.

The first resin layer 31 and the second resin layer 32 contain a resin 30R and the filler 30F. Namely, the first resin layer 31 and the second resin layer 32 contain the same resin and the same filler. It may be noted, however, that the content of the resin 30R and the content of the filler 30F differ between the first resin layer 31 and the second resin layer 32. The proportion of the resin 30R in the first resin layer 31 per unit area is higher than the proportion of the resin 30R in the second resin layer 32 per unit area. Namely, the first resin layer 31 is a resin rich layer. In other words, the proportion of the filler 30F in the first resin layer 31 per unit area is lower than the proportion of the filler 30F in the second resin layer 32 per unit area.

For example, the proportion of the resin 30R in the first resin layer 31 per unit area is greater than or equal to 70%, and the proportion of the resin 30R in the second resin layer 32 per unit area is less than or equal to 50%. The proportion of the resin 30R in the first resin layer 31 per unit area is preferably greater than or equal to 1.5 times the proportion of the resin 30R in the second resin layer 32 per unit area. For example, the proportion of the resin 30R in the first resin layer 31 per unit area may be around 1.5 times to twice as much as the proportion of the resin 30R in the second resin layer 32 per unit area, but may still suitably be greater than equal to twice as much. The proportion of resin per unit area is obtained by performing image analysis with respect to an image of a cross-section of the insulating layer.

The interconnect layer 40 is formed on the first side of the insulating layer 30. The interconnect layer 40 includes a via interconnect disposed in a via hole 30x that passes through the first resin layer 31 and the second resin layer 32 of the insulating layer 30 to expose the upper surface of the interconnect layer 20, and also includes interconnect patterns formed on the upper surface of the insulating layer 30. The via interconnect embedded in the insulating layer 30 extends through the first resin layer 31 and the second resin layer 32 to come in contact with the upper surface of the interconnect layer 20. Namely, the interconnect patterns of the interconnect layer 40 are electrically connected to the interconnect layer 20 through via interconnects. The shape of the via hole 30x is a frustum of an inverted right circular cone for which the diameter of an opening of the hole at the upper surface of the insulating layer 30 is greater than the diameter of a bottom opening of the hole at the upper surface of the interconnect layer 20, for example. An example of the material of the interconnect layer 40 is copper or the like.

[Method of Making Interconnect Substrate]

In the following, a method of making the interconnect substrate of the first embodiment will be described. FIGS. 2A through 3B are drawings illustrating examples of process steps for making the interconnect substrate according to the first embodiment. This embodiment is directed to the process steps of making a single interconnect substrate. Alternatively, however, a plurality of structures to serve as respective interconnect substrates may be made as a single piece, followed by being divided into respect interconnect substrates.

Figure 2A:
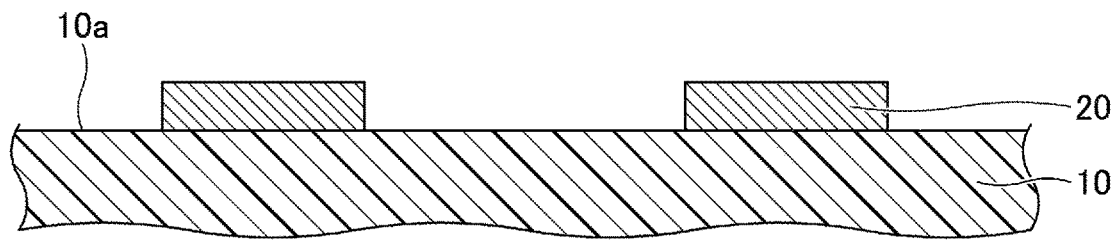
FIGS. 2A through 2C are drawings illustrating an example of process steps of making the interconnect substrate according to the first embodiment.

In the process step illustrated in FIG. 2A, the insulating layer 10 is put in place, and, then, the interconnect layer 20 is formed on the upper surface 10a of the insulating layer 10. The interconnect layer 20 may be formed by any suitable interconnect forming process such as a semi-additive process or a subtractive process. In the following, a method of making the interconnect layer 20 by use of a semi-additive method, as an example, will be described.

A seed layer made of copper (Cu) or the like is formed on the upper surface 10a of the insulating layer 10 by electroless plating or sputtering. Subsequently, a resist layer having openings corresponding to the interconnect layer 20 is formed on the seed layer. Then, electrolytic plating is performed by using the seed layer as a power feed layer to form copper (Cu) or the like on the surface of the seed layer exposed in the openings of the resist layer. The resist layer is removed, and, then, the electroplating layer is used as a mask to etch and remove the seed layer at the places not covered by the electroplating layer. With this arrangement, the interconnect layer 20 including the seed layer and the electroplating layer laminated thereon is formed.

Figure 2B:
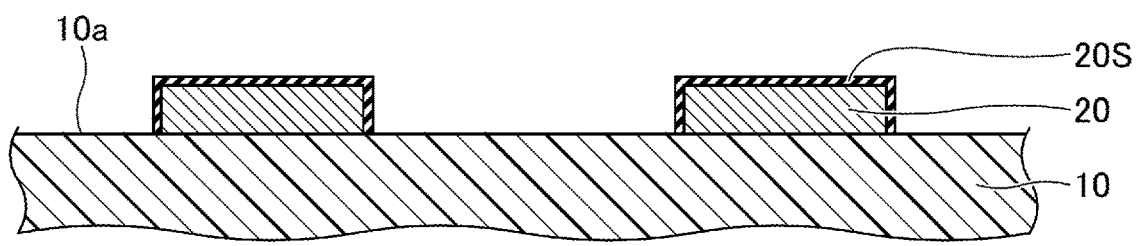

In the process step illustrated in FIG. 2B, a roughening treatment is performed with respect to the surface of the interconnect layer 20 exposed outside the insulating layer 10 (i.e., the upper surface and the side surface). After the roughening treatment, an organic coating process is performed so that the surface of the interconnect layer 20 exposed outside the insulating layer 10 (i.e., the upper surface and the side surface thereof) has oxidization resistance and has improved adhesion with the insulating layer 30. The roughening treatment may be implemented as etching, oxidizing, blasting, or the like, for example. The roughening treatment is not essential, and may be performed according to need. From the viewpoint of avoiding the occurrence of signal delay in the radio-frequency band, the surface roughness (Ra) of the upper surface and side surface of the interconnect layer 20 is preferably 0 nm or more and 200 nm or less, more preferably 0 nm or more and 150 nm or less, and particularly preferably 0 nm or more and 100 nm or less, The organic coating process may use a mixture mainly comprised of an amine compound and methanol (e.g., anticorrosive treatment liquid), for example. The organic coating process coats the upper surface and side surface of the interconnect layer 20 with an organic coating film 20S having a thickness of about 10 nm or less, for example.

Figure 2C:
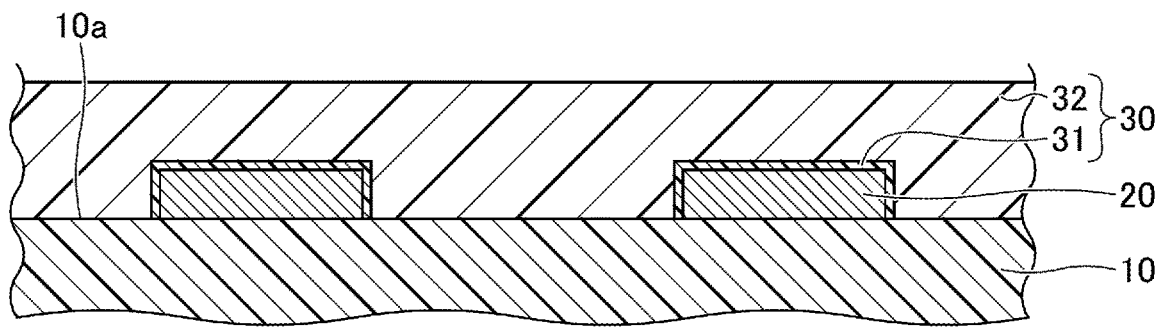

In the process step illustrated in FIG. 2C, the insulating layer 30 covering the interconnect layer 20 is formed on the upper surface 10a of the insulating layer 10. In the process step of forming the insulating layer 30, a thermosetting resin containing a filler such as silica ($SiO_2$) is prepared, and is then placed on the upper surface 10a of the insulating layer 10 such as to cover the interconnect layer 20. The thermosetting resin is heated at less than the temperature needed to set the thermosetting resin, followed by being heated at greater than the temperature needed to set the thermosetting resin thereby to cure the thermosetting resin. Examples of the thermosetting resin containing a filler include a non-photosensitive thermosetting resin film which is mainly composed of an epoxy-based resin or a polyimide-based resin in a semi-cured state. Alternatively, a non-photosensitive thermosetting resin in a liquid form or a paste form may be used in place of the epoxy-based resin film or the like.

The surface of the interconnect layer 20 exposed outside the insulating layer 10 is covered with the organic coating film 20S, so that the interconnect layer 20 immediately before being covered by the insulating layer 30 maintains an active state without reacting with oxide. Heating the thermosetting resin covering the interconnect layer causes a thermosetting reaction (i.e., cross-linking reaction) of the thermosetting resin to progress, and, at the same time, causes the metal (Cu or the like) of the interconnect layer 20 to react with the hydroxyl group in the thermosetting resin.

Only the resin component of the thermosetting resin containing a filler thus moves to the proximity of the surface of the interconnect layer exposed outside the insulating layer 10. As a result, the resin-rich first resin layer 31 is formed that covers at least part of the surface of the interconnect layer 20 exposed outside the insulating layer 10. Further, the second resin layer 32 whose resin content per unit area is lower than that of the first resin layer 31 is formed to cover the first resin layer 31. Due to the heating, also, all or part of the organic coating film 20S disappears.

When a thermosetting resin containing a filler is heated to form the insulating layer 30, two-stage heating treatments are preferably performed as described above. This arrangement serves to form the first resin layer 31 that is thick. Specifically, temperature in a low temperature range (e.g., approximately 90° C. to 140° C.) close to the minimum melting temperature of the thermosetting resin is maintained for longer than 30 minutes, and, then, temperature in a high temperature range (e.g., 160° C. and higher) needed to set the thermosetting resin is used for longer than 20 minutes, for example. This arrangement creates a long lasting state in which the thermosetting resin softens at temperature in the low temperature range and in which only the resin component readily moves to the proximity of the upper surface and side surface of the interconnect layer 20, thereby making it possible to make the first resin layer 31 thicker.

It may be noted that the filler may move together with the softened resin component that moves to the proximity of the interconnect layer 20. When the particle size of the filler varies, smaller-diameter filler particles move more easily than larger-diameter filler particles. In the proximity of the interconnect layer 20, thus, filler particles of relatively small diameters tend to gather. In other words, filler particles of relatively small diameters tend to gather in the first resin layer 31.

Figure 3A:
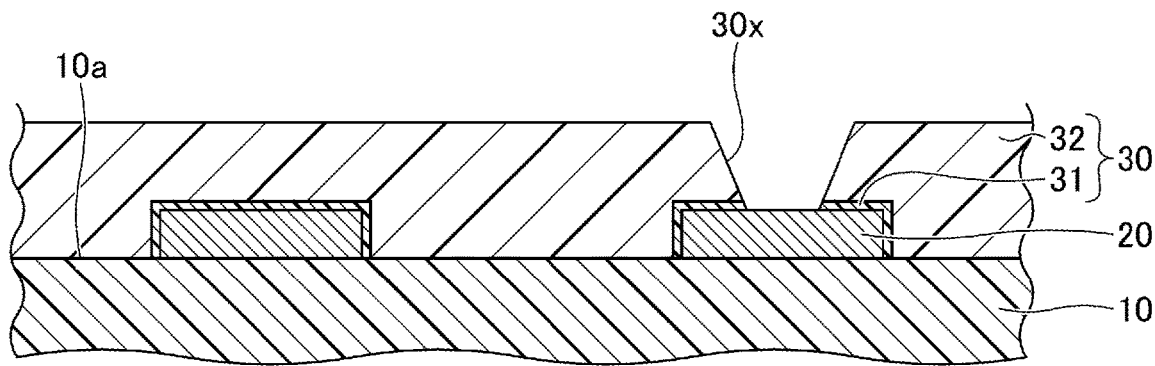
FIGS. 3A and 3B are drawings illustrating an example of process steps of making the interconnect substrate according to the first embodiment.
Figure 3B:
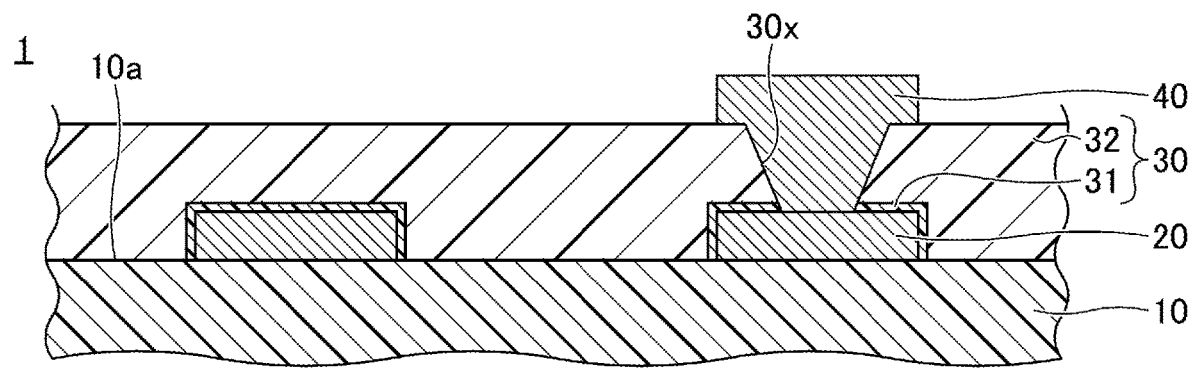

In the step illustrated in FIG. 3A, the via hole 30x is formed in the insulating layer 30 to extend through the insulating layer 30 to expose the upper surface of the interconnect layer 20. The via holes 30x may be formed by a laser process utilizing $CO_2$ laser or the like for emitting a laser beam to the insulating layer 30, for example. After the formation of the via hole 30x, a desmear process is preferably performed to remove resin residues adhering to the upper surface of the interconnect layer 20 exposed at the bottom of the via hole 30x.

Subsequently, the interconnect layer 40 is formed on the first side of the insulating layer 30. The interconnect layer 40 includes the via interconnect filling the via hole 30x and an interconnect pattern formed on the upper surface of the insulating layer 30. The interconnect pattern of the interconnect layer 40 is electrically connected to the interconnect layer 20 that is exposed at the bottom of the via hole 30x. With the process steps described above, the interconnect substrate 1 is completed in final form.

Figure 4:
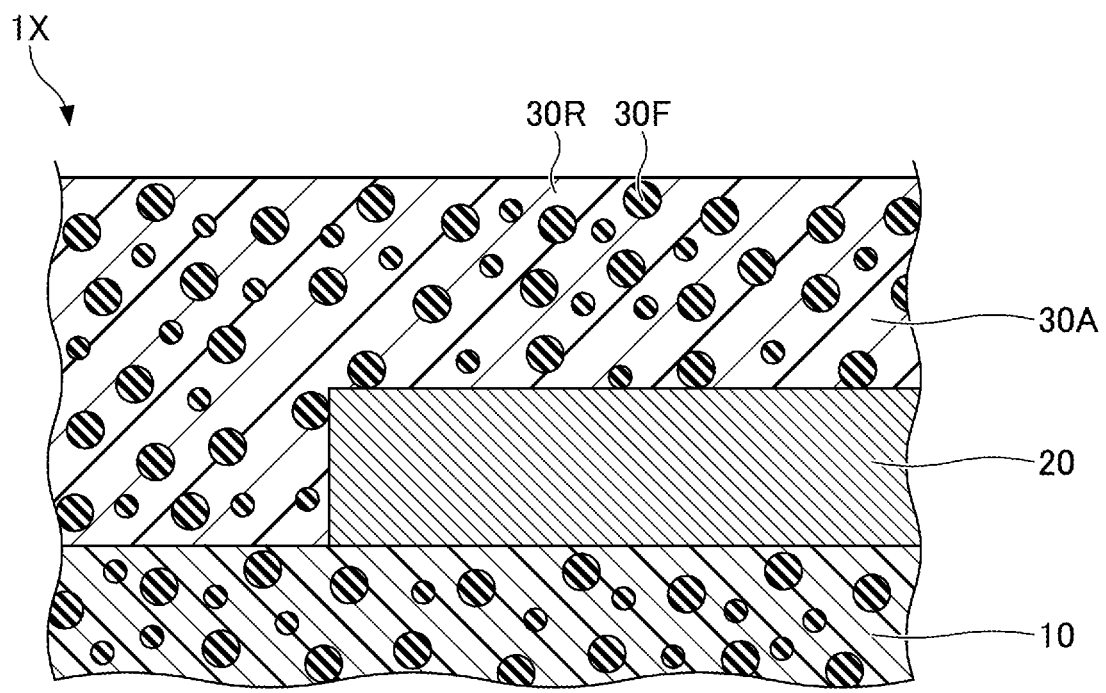
FIG. 4 is a cross-sectional view illustrating an example of an interconnect substrate according to a comparative example.

In the following, the advantages of the interconnect substrate 1 will be described by referring to a comparative example. FIG. 4 is a cross-sectional view illustrating an example of an interconnect substrate according to the comparative example. An interconnect substrate 1X illustrated in FIG. 4 differs from the interconnect substrate 1 (see FIG. 1 and the like) in that the insulating layer 30 is replaced with an insulating layer 30A.

Unlike the insulating layer 30, the insulating layer 30A does not have a two-layer structure. Namely, the proportion of a resin in the insulating layer 30A per unit area is the same as that of the second resin layer 32 of the interconnect substrate 1, and the insulating layer 30A does not include a resin-rich layer corresponding to the first resin layer 31.

Since the insulating layer 30A does not have a resin-rich layer around the interconnect layer 20, a large number of fillers 30F exist around the interconnect layer 20, and, also, there are a substantial number of fillers 30F that are in contact with the interconnect layer 20. The interconnect layer 20 and the fillers 30F are only in contact with each other, without adhering to each other. The greater the number of points at which the fillers 30F are in contact with the interconnect layer 20 are, the weaker the adhesion between the interconnect layer 20 and the insulating layer 30A is, and, thus, the more easily the interconnect layer 20 peels off the insulating layer 30A.

Especially in the case of the interconnect layer 20 having the via hole 30x on the upper surface thereof, thermal stress is applied during the laser process for forming the via hole 30x. The resin 30R around the interconnect layer 20 is thus carbonized, which further reduces adhesion, and makes it more likely for the interconnect layer 20 to peel off the insulating layer 30A.

In order to prevent peeling off at the interface between the interconnect layer 20 and the insulating layer 30A in the interconnect substrate 1X, the upper surface and side surface of the interconnect layer 20 may be given an increased roughness to provide an increased number of larger anchors. With this arrangement, the contact area between the interconnect layer 20 and the insulating layer 30A widens, thereby improving adhesion therebetween. However, large anchors in the surface of the interconnect layer 20 causes signal delay in the radio-frequency band, and are thus not preferable.

In contrast, the interconnect substrate 1 has the resin-rich first resin layer 31 formed around the interconnect layer 20, so that the contact area between the resin of the first resin layer 31 and the upper surface and side surface of the interconnect layer 20 is large. Because of this, the adhesion between the interconnect layer 20 and the insulating layer 30 becomes strong. Consequently, peeling off at the interface between the interconnect layer 20 and the insulating layer 30 is made unlikely. Even when thermal stress is applied to the interconnect layer 20 during the laser process for forming the via hole 30x, a sufficient adhesion between the interconnect layer 20 and the insulating layer 30 can be maintained to reduce the likelihood of peeling off at the interface between the interconnect layer 20 and the insulating layer 30.

In the interconnect substrate 1, the provision of the first resin layer 31 results in a sufficient adhesion between the interconnect layer 20 and the insulating layer 30, so that there is no need to create large anchors in the surface of the interconnect layer 20 as in the case of the interconnect substrate 1X. As a result, the interconnect substrate 1 can avoid the occurrence of signal delay in the radio-frequency band.

It may be particularly noted that, in recent years, insulating layers having a low thermal expansion coefficient have been required in order to reduce thermal stress to the insulating layers constituting an interconnect substrate. Because of this, the content of filler such as silica in insulating layers may sometimes exceed 50 wt %. When the content of filler in insulating layers exceeds 50 wt %, adhesion between interconnect layers and insulating layers significantly drops if no first resin layer exists as in the case of the interconnect substrate 1X. When the content of filler in insulating layers exceeds 50 wt %, therefore, the interconnect substrate having the first resin layer is advantageous particularly because peeling off at the interfaces between interconnect layers and insulating layers can be made unlikely. In the case of the interconnect substrate 1, sufficient adhesion between the interconnect layer 20 and the insulating layer 30 is obtained even when the content of filler in the insulating layer 30 exceeds 50 wt % as a whole, for example.

Practical Application Example 1

Practical application example 1 is directed to an example of a multilayer interconnect substrate that includes insulating layers having the same structure as the insulating layer 30. In connection with practical application example 1, a description of the same or similar constituent parts as those of the previously provided descriptions may be omitted as appropriate.

FIG. 5 is a cross-sectional view illustrating an example of a multilayer interconnect substrate according to practical application example 1. Referring to FIG. 5, a multilayer interconnect substrate 2 includes an interconnect layer 110, an insulating layer 111, an interconnect layer 112, an insulating layer 113, an interconnect layer 114, and a solder resist layer 115 stacked one over another on the first surface 100a of a core layer 100. The multilayer interconnect substrate 2 further includes an interconnect layer 120, an insulating layer 121, an interconnect layer 122, an insulating layer 123, an interconnect layer 124, and a solder resist layer 125 stacked one over another on the second surface 100b of the core layer 100.

The core layer 100 may be a glass epoxy substrate or the like made by impregnating a glass cloth with insulating resin such as epoxy-based resin or polyimide-based resin, for example. The core layer 100 may be a substrate made by impregnating a woven cloth or non-woven cloth of glass fiber, carbon fiber, aramid fiber, or the like with epoxy-based resin or the like.

The interconnect layer 110 is formed on the first surface 100a of the core layer 100. The interconnect layer 110 is electrically connected to the interconnect layer 120 through interconnects 105 extending through the core layer 100. An example of the material of the interconnect layer 110 is copper or the like. The insulating layer 111 is formed on the first surface 100a of the core layer 100 to cover the interconnect layer 110. An insulating resin or the like having epoxy-based resin or polyimide-based resin as a main component, for example, may be used as the material of the insulating layer 111. The thickness of the insulating layer 111 may be about 10 to 50 micrometers, for example. The insulating layer 111 contains a filler such as silica ($SiO_2$).

The interconnect layer 112 is formed on the first side of the insulating layer 111. The interconnect layer 112 includes via interconnects that fill via holes 111x extending through the insulating layer 111 to expose the upper surface of the interconnect layer 110, and also includes interconnect patterns formed on the upper surface of the insulating layer 111. The interconnect patterns of the interconnect layer 112 are electrically connected to the interconnect layer 110 through the via interconnects. The shape of the via holes 111x is a frustum of an inverted right circular cone for which the diameter of an opening of the hole toward the insulating layer 113 is greater than the diameter of a bottom opening of the hole at the upper surface of the interconnect layer 110, for example. An example of the material of the interconnect layer 112 is copper or the like.

An insulating layer 113 is formed on the upper surface of the insulating layer 111 to cover the interconnect layer 112. The material and thickness of the insulating layer 113 are substantially the same as those of the insulating layer 111. The insulating layer 113 contains a filler such as silica ($SiO_2$).

The interconnect layer 114 is formed on the first side of the insulating layer 113. The interconnect layer 114 includes via interconnects that fill via holes 113x extending through the insulating layer 113 to expose the upper surface of the interconnect layer 112, and also includes interconnect patterns formed on the upper surface of the insulating layer 113. The interconnect patterns of the interconnect layer 114 are electrically connected to the interconnect layer 112 through the via interconnects. The shape of the via holes 113x is a frustum of an inverted right circular cone for which the diameter of an opening of the hole toward the solder resist layer 115 is greater than the diameter of a bottom opening of the hole at the upper surface of the interconnect layer 112, for example. An example of the material of the interconnect layer 114 is copper or the like.

The solder resist layer 115 is the outermost layer of the multilayer interconnect substrate 2 on the first side thereof, and is formed on the upper surface of the insulating layer 113 to cover the interconnect layer 114. The solder resist layer 115 may be formed of a photosensitive resin or the like such as an epoxy-based resin, an acrylic resin, or the like. The thickness of the solder resist layer 115 may be about 5 to 40 micrometers, for example.

The solder resist layer 115 has openings 115x. Part of the upper surface of the interconnect layer 114 is situated at the bottom of the openings 115x. The plane shape of the openings 115x is circular, for example. Further, a metal layer may be formed on, or an anti-oxidizing treatment such as OSP treatment may be applied to, the upper surface of the interconnect layer 114 exposed in the openings 115x according to need.

The upper surface of the interconnect layer 114 exposed at the bottom of the openings 115x has external connection terminals 116 formed thereon. The external connection terminals 116 are solder bumps, for example. An alloy including Pb, an alloy of Sn and Cu, an alloy of Sn and Ag, or an alloy of Sn, Ag, and Cu may be used as a material to form the solder bumps. The external connection terminals 116 serve as the terminals for electrical connection to a semiconductor chip.

The interconnect layer 120 is formed on the second surface 100b of the core layer 100. An example of the material of the interconnect layer 120 is copper or the like. The insulating layer 121 is formed on the second surface 100b of the core layer 100 to cover the interconnect layer 120. The material and thickness of the insulating layer 121 are substantially the same as those of the insulating layer 111. The insulating layer 121 contains a filler such as silica ($SiO_2$).

The interconnect layer 122 is formed on the second side of the insulating layer 121. The interconnect layer 122 includes via interconnects that fill via holes 121x extending through the insulating layer 121 to expose the lower surface of the interconnect layer 120, and also includes interconnect patterns formed on the lower surface of the insulating layer 121. The interconnect patterns of the interconnect layer 122 are electrically connected to the interconnect layer 120 through the via interconnects. The shape of the via holes 121x is a frustum of a right circular cone for which the diameter of an opening of the hole toward the insulating layer 123 is greater than the diameter of an upper-end opening of the hole at the lower surface of the interconnect layer 120, for example. An example of the material of the interconnect layer 122 is copper or the like.

An insulating layer 123 is formed on the lower surface of the insulating layer 121 to cover the interconnect layer 122. The material and thickness of the insulating layer 123 are substantially the same as those of the insulating layer 111. The insulating layer 123 contains a filler such as silica ($SiO_2$).

The interconnect layer 124 is formed on the second side of the insulating layer 123. The interconnect layer 124 includes via interconnects that fill via holes 123x extending through the insulating layer 123 to expose the lower surface of the interconnect layer 122, and also includes interconnect patterns formed on the lower surface of the insulating layer 123. The interconnect patterns of the interconnect layer 124 are electrically connected to the interconnect layer 122 through the via interconnects. The shape of the via holes 123x is a frustum of a right circular cone for which the diameter of an opening of the hole toward the solder resist layer 125 is greater than the diameter of an upper-end opening of the hole at the lower surface of the interconnect layer 122, for example. An example of the material of the interconnect layer 124 is copper or the like.

The solder resist layer 125 is the outermost layer of the multilayer interconnect substrate 2 on the second side thereof, and is formed on the lower surface of the insulating layer 123 to cover the interconnect layer 124. The material and thickness of the solder resist layer 125 are substantially the same as those of the solder resist layer 115.

The solder resist layer 125 has openings 125x. The lower surface of the interconnect layer 124 is partially exposed inside the openings 125x. The plane shape of the openings 125x may be circular, for example. The portions of the interconnect layer 124 exposed in the openings 125x may be used as pads for electrical coupling to a mount substrate such as a motherboard. The previously-noted metal layer may be formed on, or an anti-oxidizing treatment such as OSP treatment may be applied to, the lower surface of the interconnect layer 124 exposed in the openings 125x according to need.

The insulating layer 111, the insulating layer 113, the insulating layer 121, and the insulating layer 123 of the multilayer interconnect substrate 2 may be structured to have a first resin layer covering at least part of the surface of an interconnect layer and a second resin layer covering the first resin layer, similarly to the insulating layer 30 of the first embodiment. This arrangement serves to improve adhesion between each of the insulating layer 111, the insulating layer 113, the insulating layer 121, and the insulating layer 123 and an interconnect layer covered thereby.

According to the disclosed technology, an interconnect substrate is provided that is capable of improving adhesion between insulating layers containing a filler and interconnect layers.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

The present disclosures non-exhaustively include the subject matter set out in the following clauses.

[Clause 8] A method of making an interconnect substrate, comprising:
forming an interconnect layer on a first surface of a first insulating layer;
coating a surface of the interconnect layer exposed outside the first insulating layer with an organic coating film; and
forming a second insulating layer formed on the first surface of the first insulating layer to cover the interconnect layer,
wherein the forming the second insulating layer includes:
disposing a thermosetting resin containing a filler on the first surface of the first insulating layer such as to cover the interconnect layer; and heating the thermosetting resin at less than a temperature needed to set the thermosetting resin, followed by heating the thermosetting resin at greater than the temperature needed to set the thermosetting resin thereby to cure the thermosetting resin, wherein in the heating, a first resin layer and a second resin layer are formed, the first resin layer covering at least part of the surface of the interconnect layer exposed outside the first insulating layer, the second resin layer covering the first resin layer, wherein both the first resin layer and the second resin layer contain a resin and a filler, and wherein a proportion of the resin in the first resin layer per unit area is higher than a proportion of the resin in the second resin layer per unit area.

[Clause 9] The method as recited in clause 8, further comprising roughening the surface of the interconnect layer exposed outside the first insulating layer before the coating.

[Clause 10] The method as recited in clause 8 or 9, further comprising emitting a laser beam to the second insulating layer to form a via hole in the second insulating layer through both the first resin layer and the second resin layer to expose the interconnect layer.

What is claimed is:

1. An interconnect substrate, comprising:

a first insulating layer; and an interconnect layer formed on a first surface of the first insulating layer; and a second insulating layer formed on the first surface of the first insulating layer to cover the interconnect layer, wherein the second insulating layer includes a first resin layer and a second resin layer, the first resin layer covering at least part of a surface of the interconnect layer exposed outside the first insulating layer, the second resin layer covering the first resin layer, wherein the second resin layer is in contact with both the first resin layer and the first surface of the first insulating layer, wherein both the first resin layer and the second resin layer contain a resin and a filler, and wherein a proportion of the resin in the first resin layer per unit area is higher than a proportion of the resin in the second resin layer per unit area.

2. The interconnect substrate as claimed in claim 1, wherein the proportion of the resin in the first resin layer per unit area is greater than or equal to 1.5 times the proportion of the resin in the second resin layer per unit area.

3. The interconnect substrate as claimed in claim 1, wherein a proportion of the filler in the first resin layer per unit area is lower than a proportion of the filler in the second resin layer per unit area.

4. The interconnect substrate as claimed in claim 1, wherein a thickness of the first resin layer is less than a thickness of the second resin layer.

5. The interconnect substrate as claimed in claim 1, wherein a content of the filler in the second resin layer as a whole is greater than or equal to 50 wt %.

6. The interconnect substrate as claimed in claim 1, wherein a surface roughness of the surface of the interconnect layer exposed outside the first insulating layer is less than or equal to 200 nm.

7. The interconnect substrate as claimed in claim 1, further comprising a via interconnect embedded in the second insulating layer and extending through the first resin layer and the second resin layer to come in contact with the interconnect layer.

8. The interconnect substrate as claimed in claim 1, wherein a thickness of the first resin layer is less than a thickness of the interconnect layer.

9. The interconnect substrate as claimed in claim 1, wherein the first resin layer and the second resin layer are made of a thermosetting resin.

10. The interconnect substrate as claimed in claim 1, wherein the interconnect layer has a first surface facing the first insulating layer, a second surface opposite the first surface of the interconnect layer, and a side surface, wherein the second surface of the interconnect layer and the side surface of the interconnect layer are exposed outside the first insulating layer, and wherein the first resin layer covers the second surface of the interconnect layer and the side surface of the interconnect layer.

* * * * *